United States Patent
Clark

(10) Patent No.: US 6,201,428 B1
(45) Date of Patent: Mar. 13, 2001

(54) 5-VOLT TOLERANT 3-VOLT DRIVE PUSH-PULL BUFFER/DRIVER

(75) Inventor: Lawrence T. Clark, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/272,766

(22) Filed: Mar. 18, 1999

(51) Int. Cl.[7] .................................................... H03K 5/00

(52) U.S. Cl. ............................................ 327/333; 327/331

(58) Field of Search ..................................... 327/108, 112, 327/333, 331, 318; 326/82, 83, 87, 63, 68, 80, 81

(56) References Cited

U.S. PATENT DOCUMENTS 5,568,062 * 10/1996 Kaplinsky ............................... 326/27
6,054,888 * 4/2000 Maley ..................................... 327/333

* cited by examiner

*Primary Examiner*—Tuan T. Lam
*Assistant Examiner*—Hiep Nguyen
(74) *Attorney, Agent, or Firm*—Fish & Richardson P.C.

(57) ABSTRACT

A buffer/driver system that operates on an input signal to provide an output signal with a sufficient capability at an output terminal to drive a particular interface is disclosed. The input signal is operated on to produce the output signal that has wider voltage swing than the input signal. Therefore, the devices in a circuit that is producing the input signal can operate with low voltages, while the output signal can drive other systems with sufficient voltage levels.

39 Claims, 8 Drawing Sheets

5-VOLT TOLERANT 3-VOLT DRIVE PUSH-PULL BUFFER/DRIVER

BACKGROUND

The present specification generally relates to integrated circuits. More particularly, the present specification describes a buffer/driver system.

Technology advances in integrated circuit fabrication have led to more compact chip designs. Lower voltage processes come with the smaller size. CMOS devices can use low voltage power supplies to prevent damage to devices having small feature sizes, and to reduce the overall power consumption. For example, power supplies for CMOS devices are being reduced from 3.3 volts to 2.5 volts and lower. However, low voltage CMOS devices often interface with transistor—transistor logic (TTL) devices that operate at higher supply voltages, e.g., 5 volts.

The Peripheral Component Interconnect (PCI) bus standard, PCI Compliance Checklist, Revision 2.1, published Jan. 1, 1997, requires a minimum of 2.4 volts on the bus to identify a high transition. Typically, there are a large number of buffers and drivers tied to the bus, any of which can be a TTL device. Therefore, each device must be capable of driving at least 2.4 volts, and be able to withstand voltage levels as high as 6.5 volts.

Another issue with multiple supply voltages is that the different voltages have different characteristics. Some voltages may be stable before others. In a worst case scenario, the highest voltage, e.g., 5 volts, may stabilize first, and already be at its highest level while the other voltages, e.g., 3.3 volts and 1.8 volts, are still at ground or low level. Such an initial condition at power-up could expose low voltage CMOS devices to the full 5 volts. This can cause damage to the device or a shortened life. For example, this could damage the gate oxide in the transistors that form the devices. This situation can be exacerbated by the PCI specification, which requires some of the PIN's to power up at 5 volts.

SUMMARY

The present disclosure describes a buffer/driver system that operates on an input signal to provide an output signal with a sufficient capability at an output terminal to drive a particular interface. The input signal is operated on to produce the output signal that has wider voltage swing than the input signal. Therefore, the devices in a circuit that is producing the input signal can operate with low voltages, while the output signal can drive other circuits with sufficient voltage levels.

Other embodiments and advantages will become apparent from the following description and from the claims.

BRIEF DESCRIPTION OF THE DRAWINGS

These and other aspects of the invention will now be described with reference to the attached drawings, in which.

DETAILED DESCRIPTION

The present disclosure describes one embodiment of a buffer/driver system that can tolerate a TTL voltage level, nominally 5 volts. The system also supplies sufficient drive capability at an output terminal to meet a minimum voltage required by the PCI bus specification. The nominal driving voltage is 3.3 volts. An input signal is level-shifted and divided to produce an output signal with wider voltage swing. For example, the system operates on a zero-to-1.8-volt input data signal to produce a zero-to-3.3-volt output signal.

Figure 1:
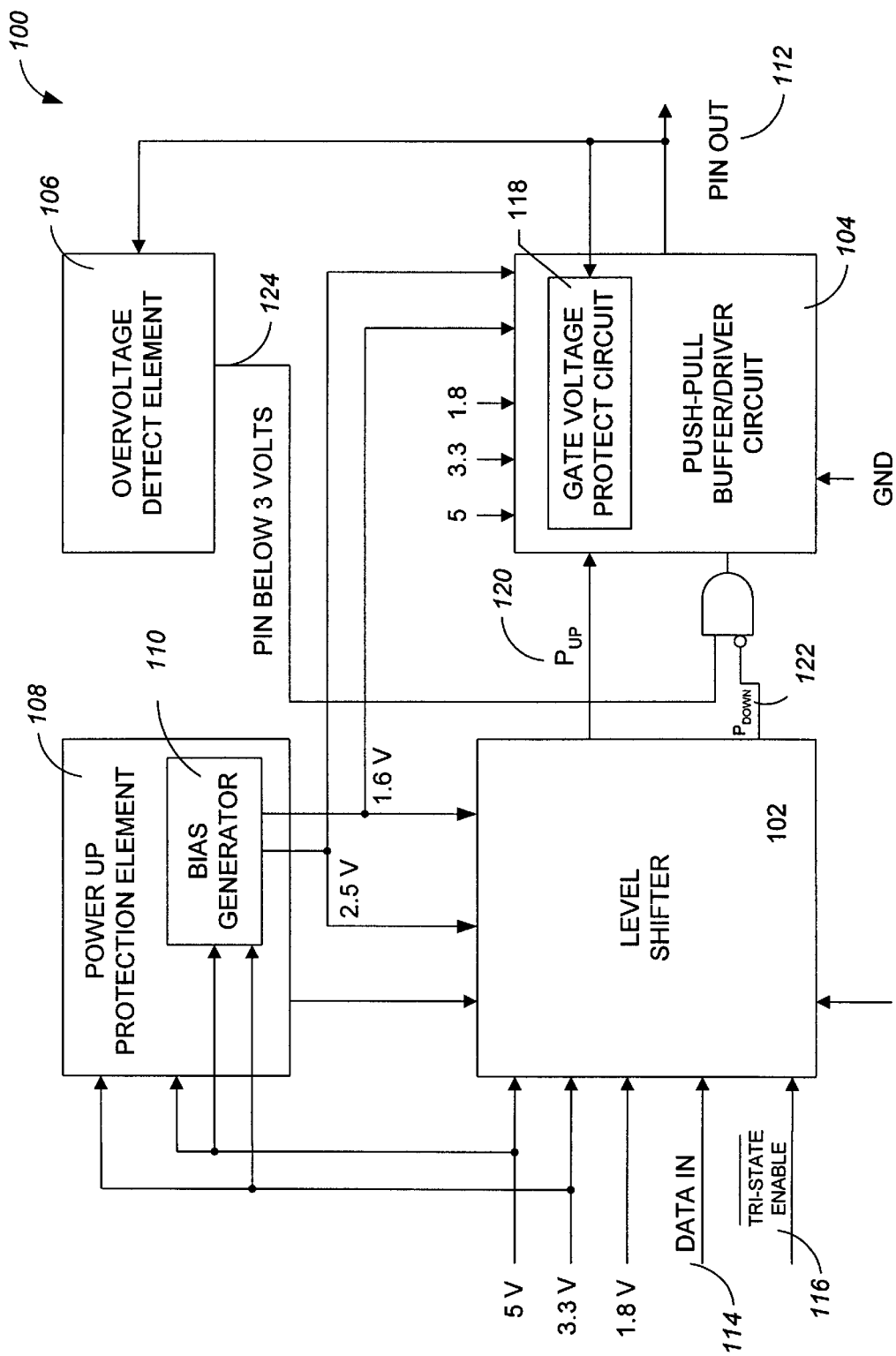
FIG. 1 is a block diagram of one embodiment of a buffer/driver apparatus.

FIG. 1 shows a block diagram of one embodiment of a buffer/driver apparatus. The apparatus includes a level shifter circuit 102, a push-pull buffer/driver circuit 104, an over-voltage detect circuit 106, and a power-up protection circuit 108.

The level shifter circuit 102 shifts and divides the small input voltage swing into two complementary signals, $P_{up}$ 120 and $P_{down}$ 122, each signal driving a pull-up or a pull-down signal for the push-pull circuit. For one embodiment, the input signal, Data-In 114, swings between zero and about 1.8 volts. When Data-In 114 is at logic high (1.8 volts), $P_{down}$ is set to zero volts while $P_{up}$ is set to 1.9 volts. When Data-In 114 is at logic low (zero volts), $P_{down}$ changes to 1.8 volts while $P_{up}$ changes to 3.3 volts. When tri-state is enabled (i.e. $\overline{\text{Tri-state Enable}}$ signal set to zero), both $P_{down}$ and $P_{up}$ is de-asserted with $P_{down}$ set to zero volts and $P_{up}$ set to 3.3 volts.

The push-pull buffer/driver circuit 104 is driven by two different level-shifted signals. One is a pull-up signal and the other is a pull-down signal. The circuit provides the PIN 112 with a wide voltage swing sufficient to drive other apparatuses that are tied directly to the PIN 112 or to a bus. The pull-down and the pull-up signals are combined in a push-pull transistor configuration to produce the wider voltage swing. The circuit also protects transistors from high voltage signals, such as 5 volts, on the PIN 112.

The over-voltage detect circuit 106 detects when the PIN 112 is receiving a high voltage, e.g., above 3.3 volts. If the PIN is already being subjected to a high voltage, the over-voltage detect circuit 106 generates a flag 124. The flag 124 prevents the push-pull buffer/driver circuit from trying to drive the PIN and thereby expose the low voltage supplies to the high voltage.

The power-up protection circuit 108 protects devices in the level shifter circuit 102 and the push-pull buffer/driver circuit 104 from being exposed to the full extent of the high voltages during power-up. The devices that need protection include CMOS devices that are highly susceptible to damage due to high voltages and static potentials. The power-up protection circuit generates a bias voltage from the first supply voltage that comes up at power up. The first supply voltage is usually the highest supply voltage, such as 5-volt supply. The generated bias voltage is applied to the other supply voltages at power-up to avoid exposing devices to high voltage differences.

An example of an operation of the power-up protection circuit is as follows: at power-up, the low voltage supplies, such as 1.8 volts and 3.3 volts, may still be at ground level while the PIN and the 5-volt supply is already at its peak level; the bias generator 110 generates 1.6 volts and 2.5 volts from the 5-volt supply and applies them to the low voltage supplies; the result is the reduction of exposure to high voltage differences for delicate devices by as much as 50%.

Figure 2:
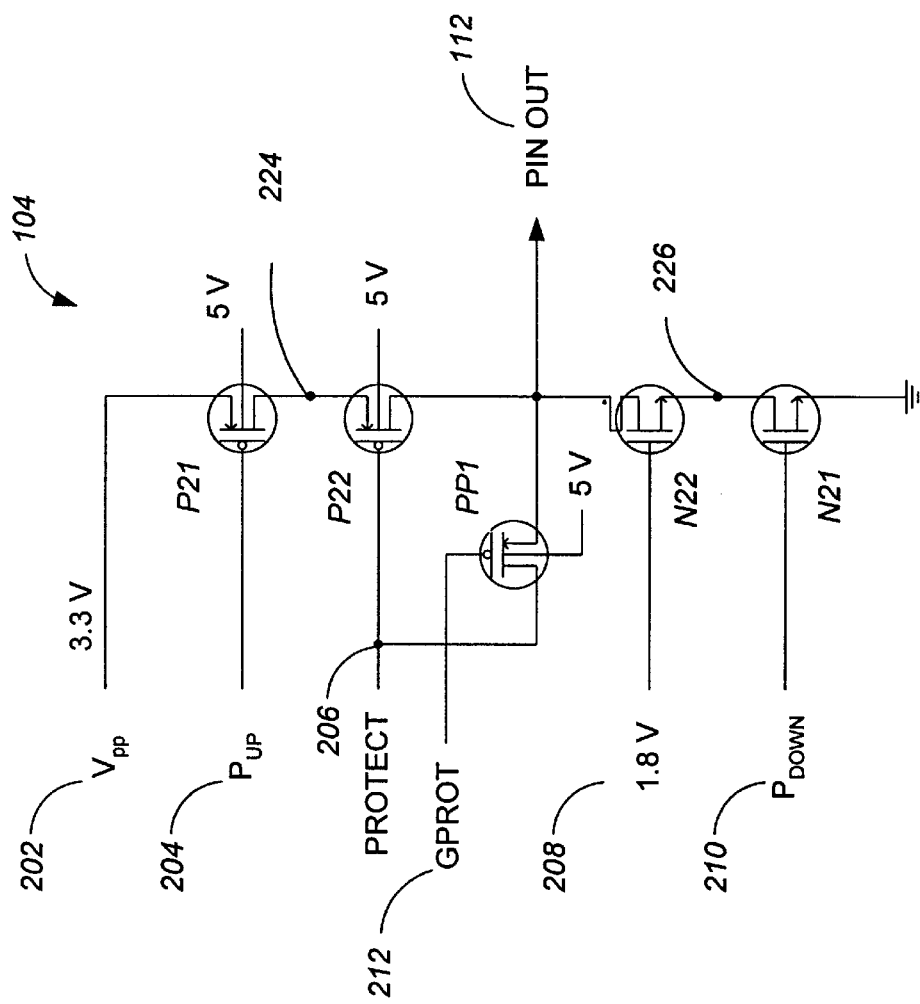
FIG. 2 is a schematic diagram of a push-pull buffer/driver circuit.

FIG. 2 is a schematic diagram of the push-pull buffer/driver circuit 104 according to one embodiment of the present disclosure. According to the disclosure, p-channel metal-oxide semiconductor (PMOS) transistor P21 act as a pull-up transistor that pulls up the node 224 when $P_{up}$ is active. NMOS transistor N21, analogously acts as a pull-down transistor. Hence, the circuit is in a push-pull configuration. Transistors P22 and N22 are voltage protection transistors that protect transistors P21 and N21 by limiting the voltage swings across the terminals of those transistors P21 and N21.

The voltage at node 224 is limited to the voltage at the gate terminal of transistors P22 plus a p-channel threshold voltage. The voltage at node 226 is limited to the voltage at the gate terminal of transistor N22 minus an n-channel threshold voltage.

Pass-gate transistor PP1 controls cut off of node 224 from the PIN 112 when a high voltage is present on the PIN. The gate terminal of the pass-gate transistor PP1 is protected by GPROT 212. When the PIN 112 is at 5 volts, GPROT 212 is biased at about $(3+V_{tp})$ volts, where $V_{tp}$ is a PMOS threshold voltage. The bias at GPROT 212 passes the 5 volts present on the PIN 112 to the PROTECT node 206. This, in turn, cuts off transistor P22 and isolates node 224. This operation protects transistor P21 which could otherwise short between the 3.3-volt supply 202 and the 5 volts present on the PIN 112. Therefore, the 5 volts can only appear on the PIN when the buffer/driver system is in a receiving mode with the output in tri-state. The gate terminal of transistor P21 is protected by the Tri-state Enable signal 116. Logic low on the Tri-state Enable 116 keeps $P_{up}$ 204 at 3.3 volts, thereby turning off transistor P21 and isolating $V_{pp}$ 202 from node 224.

Transistor N22 is a vertical double-diffused n-channel MOSFET (VDNMOS) device that has two or more of the semiconductor regions formed by diffusion. Source and drain electrodes are on opposite wafer surfaces so that a current flow is substantially perpendicular to the wafer surfaces. VDNMOS devices are typically used in power switching applications where the source electrode is near ground potential and the drain electrode is biased at very high potential.

The pull-down transistor N21 is protected by voltage protection transistor N22 in a cascode configuration. Node 226 is limited to $(1.8-V_{tn})$ volts by transistor N22, where $V_{tn}$ is an NMOS threshold voltage. VDNMOS transistor N22 can tolerate 5 volts on its drain terminal with its source terminal at $(1.8-V_{tn})$ volts. If VDNMOS transistor N22 can tolerate over 6 volts, then the transistor N21 can be eliminated with node 226 tied to the ground. The gate terminal of N22 then should be tied to $P_{down}$ instead of the 1.8-volt supply.

Figure 3:
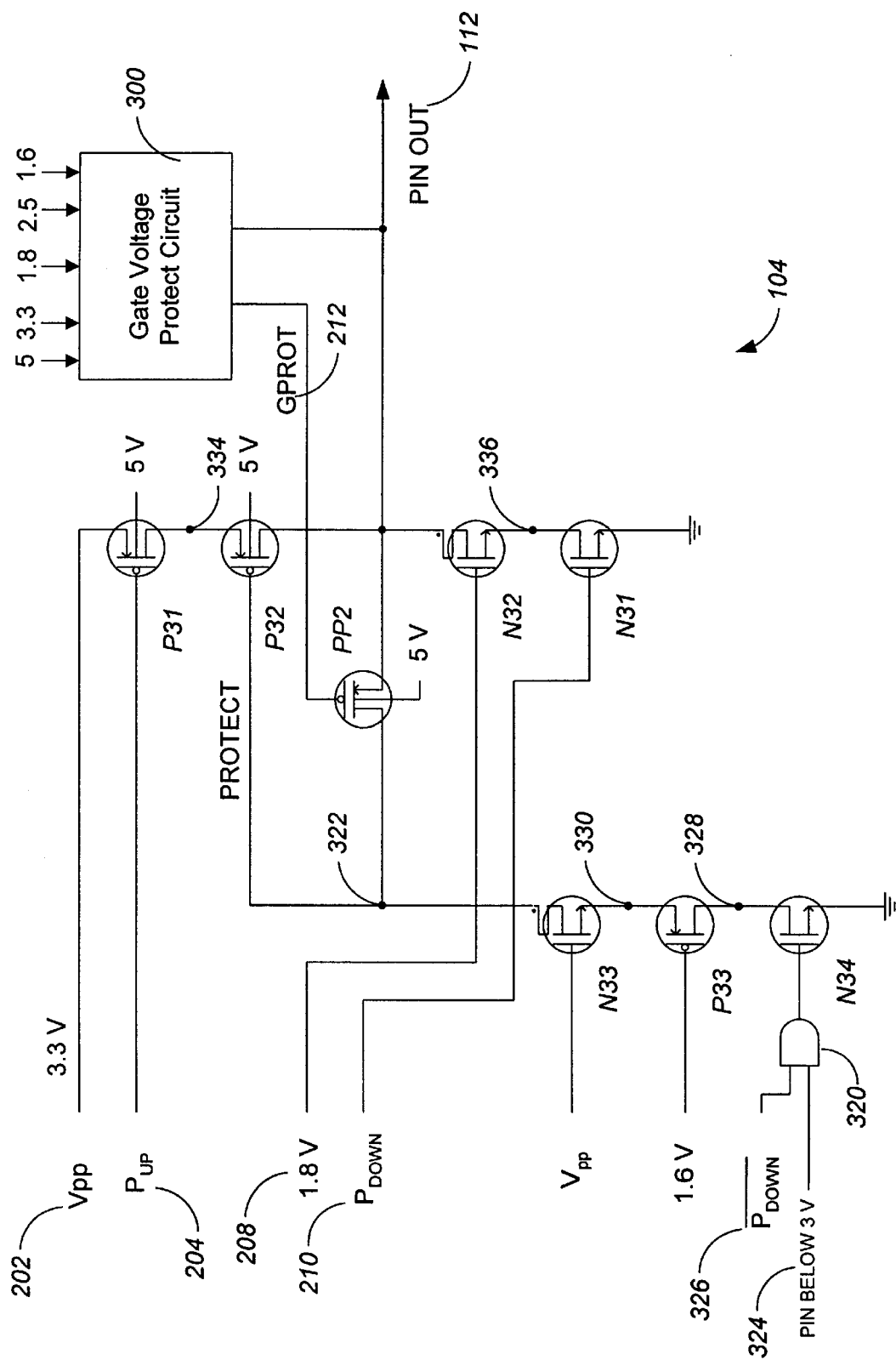
FIG. 3 is a schematic diagram of an alternative embodiment of the push-pull buffer/driver circuit.

FIG. 3 is a schematic diagram of an alternative embodiment of the push-pull buffer/driver circuit 104. This embodiment is similar to the embodiment of FIG. 2, but with additional transistors that control PROTECT node 322 shown. Transistors N33, P33 and N34 enable transistor P32 to drive the PIN 112 to 3.3 volts and disable transistor P32 when the PIN 112 is already at 5 volts.

When the PIN 112 is at 5 volts, 'PIN Below 3V' signal 324 is de-asserted and set to zero volts. The low 'PIN Below 3V' signal turns off pull-down transistor N34 through an AND gate 320. This allows transistor PP2 to pass the 5 volts on the PIN 112 to PROTECT node 322 and to turn off transistor P32. This configuration yields a circuit in high-impedance, tri-state mode. Generation of the 'PIN Below 3V' signal is described in detail under description for FIG. 5.

When the PIN 112 needs to be driven to 3.3 volts, in response to a logic high in Data-In 114 signal, $P_{up}$ 204 is at 1.9 volts, $P_{down}$ 210 at zero volts, and $\overline{P_{down}}$ 326 at 1.8 volts. In response to above voltages on the gate terminals of transistors P31, N31 and N34, transistors P31 and N34 turn on while transistor N31 turns off.

Transistor N34 turns on and pulls PROTECT node 322 toward ground potential. Node 328 is driven to zero volts. However, transistor P33 prevents node 330 from going too low. The bias of 1.6 volts on the gate terminal of transistor P33 keeps node 330 at approximately 1.9 volts $(1.6+V_{tp})$. The biasing of node 330 is important in protecting the source terminal of VDNMOS transistor N33 since VDNMOS is a directional device. With node 330 biased at 1.9 volts, the PROTECT node 322 is also pulled to about 1.9 volts. This turns on transistor P32 and drives the PIN 112 to 3.3 volts with current flowing from the PIN 112 terminal to $V_{pp}$ 202. Transistor N32 protects node 336 and transistor N31 with cascode configuration.

When the PIN 112 needs to be driven to zero volts, in response to a logic low in Data-In 114 signal, $P_{up}$ 204 is at 3.3 volts, $P_{down}$ 210 at 1.8 volts, and $\overline{P_{down}}$ 326 at zero volts. This turns transistors P31 and N34 off and turns transistor N31 on. The pull-down stack, N33/P33/N34, tied to the PROTECT node 322 is disabled. Transistor N32 has its gate tied to 1.8 volts, keeping it always on. Transistor N31 therefore turns on to pull the PIN 112 to zero volts. If VDNMOS transistor N32 can tolerate over 6 volts, then the transistor N31 can be eliminated with node 336 tied to the ground. The gate terminal of N32 then should be tied to $P_{down}$ instead of the 1.6-volt supply.

The gate voltage protect circuit 300 drives GPROT 212 to $(1.8-V_{tp})$ volts, thereby protecting transistor PP2 from high voltage bias. The PROTECT node 322 is biased to about 1.8 volts via transistor PP2. This, in turn, keeps node 334 biased to about 2.5 volts $(1.8+2V_{tp})$ and protects the gate terminal of transistor P31 which is at 3.3 volts.

The case of receiving zero volts is substantially the same as the driving zero volt case. The differences are the $P_{down}$ signal 210 is at zero volts, turning off transistor N31.

The inputs to AND gate 320 turn transistor N34 on only if the tri-state mode is disabled, the PIN 112 is below 3.3 volts, and the pull-down signal is at logic low. Therefore, transistor N34 is turned off when the circuit is in voltage receiving mode.

Figure 4:
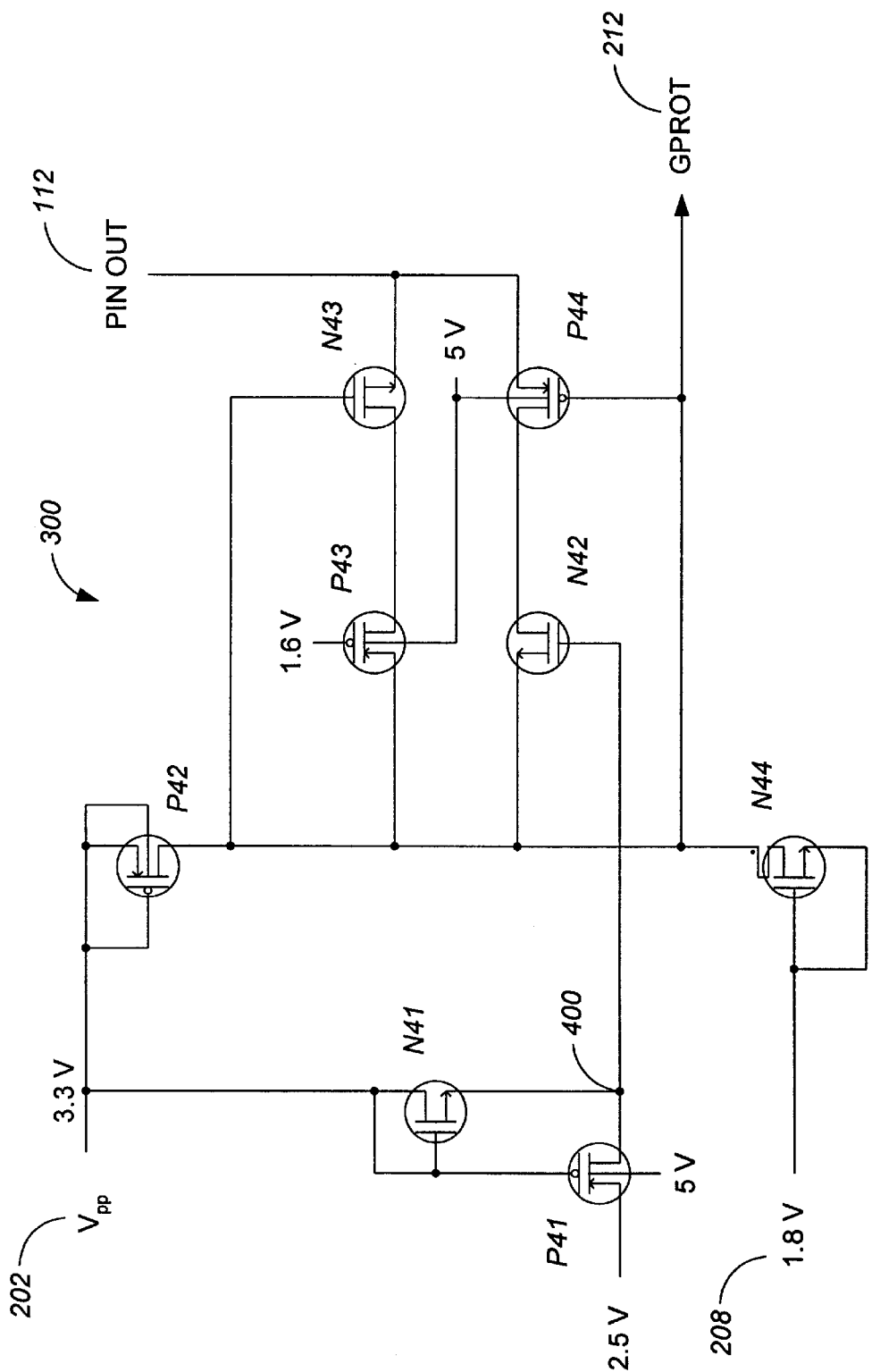
FIG. 4 is a schematic diagram of a gate voltage protect circuit in the push-pull buffer/driver circuit.

FIG. 4 is a schematic diagram of the gate voltage protect circuit 300 in the push-pull buffer/driver circuit 104 according to the preferred embodiment of the present disclosure. This circuit pushes and pulls the signal GPROT 212 to protect the gate terminal of the pass-gate transistor PP2. The circuit pulls GPROT 212 high to about 3 volts when 5 volts is on the PIN 112 and pushes GPROT 212 low to about two volts when the PIN 112 is at zero volts. Therefore, GPROT 212 swings between two and three volts.

During normal operation, transistor N41 drives node 400 to about 3 volts $(V_{pp}-V_{tn})$. However, during power-up, if $V_{pp}$ is at zero volts, P41 turns on and node 400 gets driven through P41 to 2.5 volts.

When the PIN 112 is at zero volts, transistor P44 turns off and transistor N43 turns on, making a current path from GPROT 212 to the PIN via P43 and N43. This pulls GPROT 212 low. Transistor P43 limits GPROT 212 voltage to about two volts (1.6+$V_{tp}$). VDNMOS transistor N44 clamps GPROT above (1.6–$V_{tn}$) volts.

When the PIN 112 is at 5 volts, transistor P44 turns on and transistor N43 turns off, pulling GPROT 212 high. Transistor N42 limits GPROT 212 voltage to about (3.0+$V_{tn}$) volts. Transistor P42 clamps GPROT below (3.3+$V_{tp}$) volts.

The clamp devices P42 and N44 are desirable due to high Miller capacitance on transistor PP2 in the push-pull buffer/driver circuit. The devices prevent the gate of transistor PP2 from swinging too far and too hard. Furthermore, during fast operation, the Miller capacitance of PP1 becomes the primary mover of the GPROT 212 signal, making P42 and N42 critical.

Figure 5:
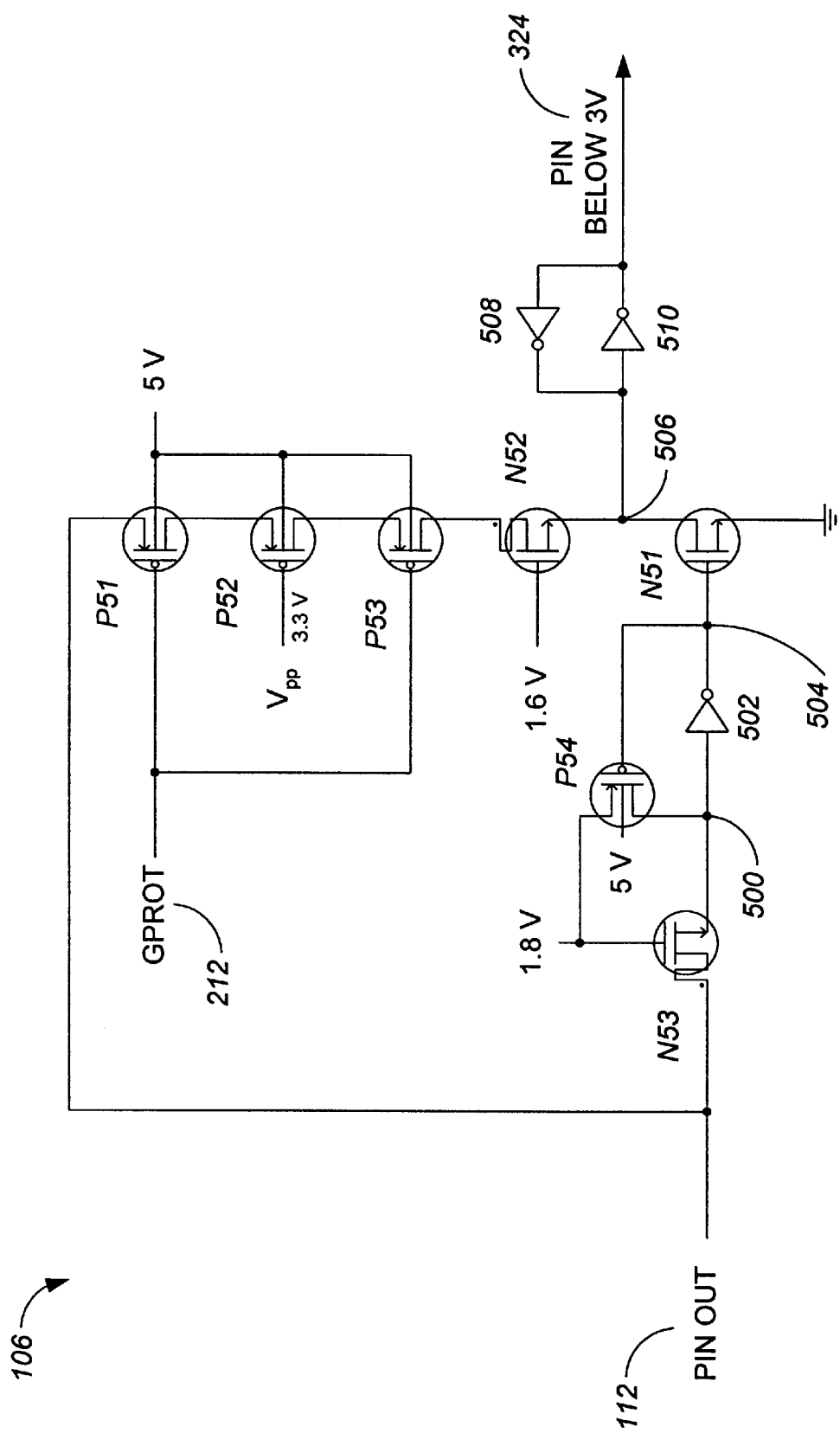
FIG. 5 is a schematic diagram of an over-voltage detect circuit.

FIG. 5 shows a schematic diagram of the over-voltage detect circuit 106 according to the preferred embodiment of the present disclosure. A main function of this circuit is to avoid driving PROTECT node 322 below two volts when the PIN 112 is at 5 volts. That is, if the PIN is at 5 volts, this circuit prevents the buffer/driver from driving PIN to 3.3 volts. Otherwise, the pull-up circuitry would be stressed from attempting to drive the circuitry in this way.

PIN 112 is connected to the source of the transistor P51. When the PIN 112 goes to zero volts, p-channel metal-oxide semiconductor field-effect transistors (PMOSFETs) P51 to P53 turn off. Node 500 is pulled low via transistor N53. Transistor P54 and inverter 502 "latch" the logic low on node 500 to a logic high on node 504. The logic high voltage of 1.8 volts on node 504 turns transistor N51 on and pulls 'PIN Above 3 V' node 506 to an inactive logic low of 0 volts. This drives 'PIN Below 3 V' signal to an active logic high of 1.8 volts via inverters 508 and 510. Transistors P51 and P53 protect transistor P52 when the PIN 112 and 'PIN Above 3 V' node 506 are at zero volts, respectively.

When the PIN 112 is at 5 volts, node 500 is pulled high via cascode transistor N53. Transistor P54 and inverter 502 "latch" the logic high on node 500 to a logic low on node 504. This turns transistor N51 off. At the same time, PMOSFET transistors P51 to P53 are turned on, pulling 'PIN Above 3 V' node 506 up via VDNMOS transistor N52. Transistor P52 allows 'PIN above 3V' node 506 to pull up only when the PIN 112 is above 3.3 volts. Transistor N52 limits the pull-up voltage to about (1.6–$V_{tn}$) volts to avoid high voltages on 'PIN above 3V' node 506.

Figure 6:
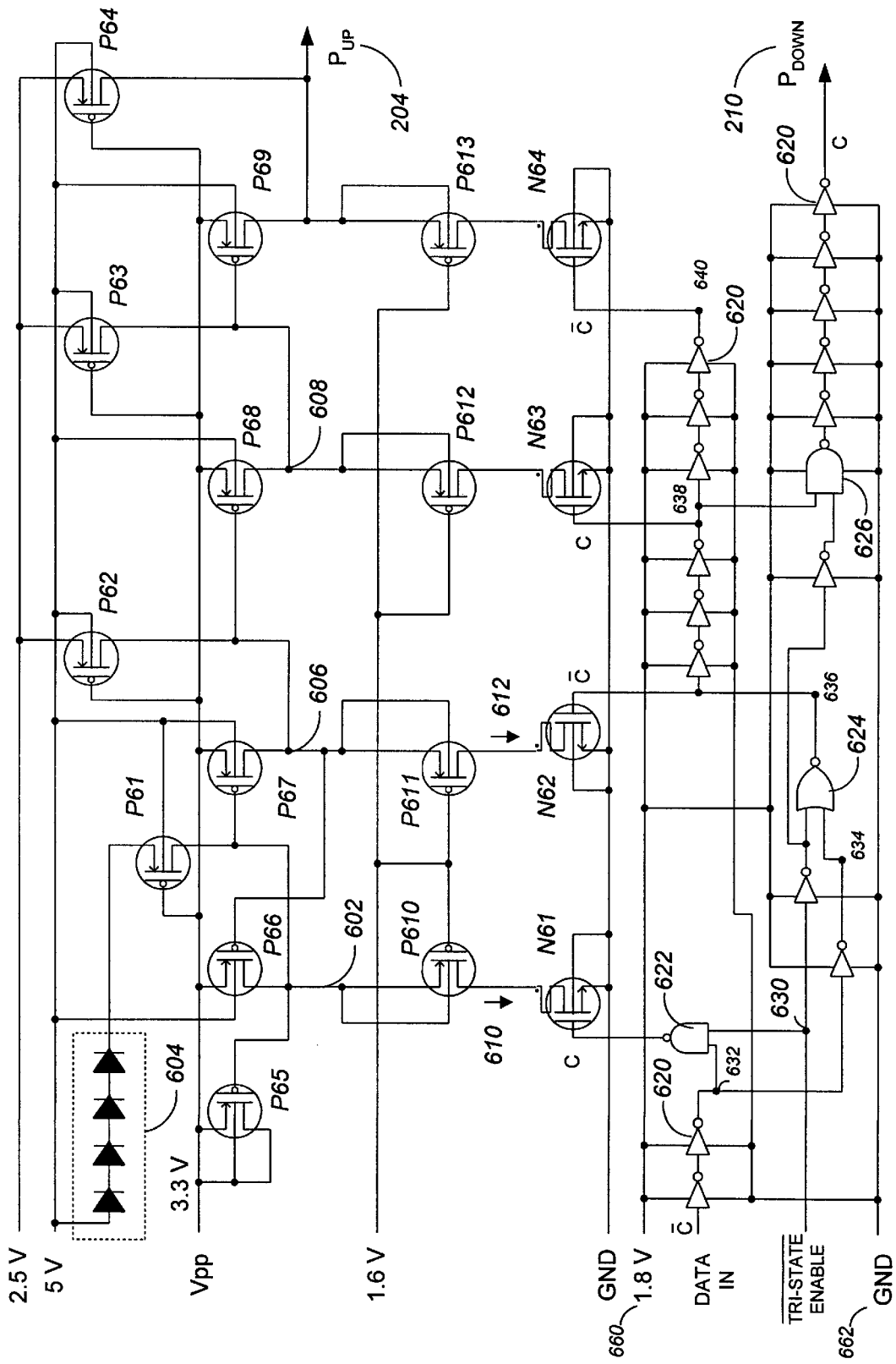
FIG. 6 is a schematic diagram of a level shifter circuit and a power-up protection circuit.

FIG. 6 is a schematic diagram of the level shifter circuit 102 and the power-up protection circuit 108 according to the preferred embodiment of the present disclosure. The power-up protection circuit 108 includes a diode chain 604 and transistors P61 to P66. The diode chain 604 is preferably formed from diode-connected parasitic PNP transistors.

Initially, at power-up, the diode chain 604 is forward biased. Therefore, the transistor P61 is turned on. This, in turn, charges node 602 to about 2.2 volts. There is a DC current path between the diode chain 604 and $V_{pp}$ because transistor P66 is turned on initially. Transistor P65 balances the differential stage formed by P66 and P67. Once all the voltages are powered up, the diode chain 604 will shut-off and remain quiescent.

During power-up, a 5-volt supply can be at its highest level while $V_{pp}$ is still at a ground level. In this situation, the gate terminals of transistors P61 to P64, which are connected to $V_{pp}$, are at zero volts. Hence, PMOS transistors P61 to P64 are turned on. The pull-up nodes 606, 608 and 204 are immediately charged to 2.5 volts, since 2.5 volts is generated from the 5-volt supply.

The charging of the pull-up node 204 to 2.5 volts turns transistor P31 off when $V_{pp}$ is at 0 volts. Node 334 is isolated from $V_{pp}$ and is charged to (2.5+$V_{tp}$) volts. Since the PIN also powers up at 5 volts, charging of node 334 to (2.5+$V_{tp}$) volts protects transistor P32 from being exposed to full 5 volts across its source-to-gate and source-to-drain terminals.

Once all the voltage supplies power up to their peak level, the level shifter circuit enters normal operation and PMOSFET transistors P61 through P64 are turned off. In normal level shifter operation, the input data switches between zero and 1.8 volts. This allows VDNMOS differential transistor pair N61 and N62 to direct current through current paths 610 or 612. Assuming $\overline{\text{Tri-state Enable}}$ 116 signal is inactive high, selecting the tri-state mode to disabled, a NAND gate 622 and a NOR gate 624 act as inverters. Therefore, when Data-In 114 is a logic high, the gate terminal of transistor N61 is a logic low and the gate terminal of transistor N62 is a logic high. Transistor N61 is off and transistor N62 is on. As transistor N62 turns on, it pulls node 606 toward ground by discharging current 612 through the voltage protection transistor P611. When the node 606 drops to about (1.6+$V_{tp}$) volts, transistor P611 turns off and prevents further discharging of the node 606. Thus, the voltage protection transistor P611 bounds the voltage swing of node 606 to between about 1.9 and 3.3 volts.

Since the gate of transistor P66 is tied to node 606, the low level on node 606 turns transistor P66 on and pulls node 602 up toward $V_{pp}$, which is at 3.3 volts. The logic high on node 602, which is tied to the gate of transistor P67, turns transistor P67 off. As node 602 rises, transistor P610 turns off and halts discharging of the current 610.

Logic low on Data-In 114 operates similarly with transistor N61 on and transistor N62 off. Node 606 is charged to high voltage near 3.3 volts. Hence, the node 606 is the pull-up node that responds inversely to Data-In 114 signal, producing about 1.9 volts when Data-In 114 is at logic high and 3.3 volts when Data-In 114 is at logic low.

Transistors P68, P612, N63 and P69, P613, N64 represent two stages of gain amplifiers to give greater drive for the level-shifted pull-up output 204. The level-shifted pull-up output 204 follows node 606. If node 606 is 1.9 volts, transistor P68 turns on pulling node 608 to 3.3 volts, thereby turning P69 off. $P_{up}$ node 204 gets biased to 1.9 volts by P613. On the other hand, if node 606 is 3.3 volts, transistor P68 turns off, and biases node 608 to 1.9 volts via transistor P612, thereby turning transistor P69 on. $P_{up}$ node 204 gets pulled up to 3.3 volts through transistor P69.

A series of inverters 620 are used to synchronize the pull-down signal 210 with the pull-up signal 204. The inverters are powered by a 1.8-volt supply 660 and a ground voltage supply 662. When the tri-state mode is disabled, node 630 is at logic high or 1.8 volts. Thus, when Data-In 114 is at logic low, node 632 is also at logic low and the output of a NAND gate 622 becomes logic high. On the other hand, when Data-In 114 is at logic high, node 632 is at logic high and the output of the NAND gate 622 becomes logic low. Therefore, the NAND gate 622 acts as an inverter when the tri-state mode is disabled.

Node 634 is pulled to logic high when Data-In 114 is at logic low. This, in turn, drives node 636 to logic low via a NOR gate 624. Similarly, when Data-In 114 is at logic high, node 636 is at logic high. Therefore, when Data-In 114 is at logic low, the gates 622 and 624 turn transistor N61 on and transistor N62 off. When Data-in 114 is at logic high, the gates 622 and 624 turn transistor N61 off and transistor N62 on.

Nodes 638 and 640 are driven to logic high and logic low, respectively, in response to Data-In 114 at logic low. Similarly, nodes 638 and 640 are driven to logic low and logic high, respectively, in response to Data-In 114 at logic high. Thus, transistor N63 turns on and transistor N64 turns off when Data-In 114 is at logic low.

When the node 638 is at logic high, in response to logic low at Data-In 114, a NAND gate 626 and five inverters 620 drive the pull-down signal to logic high, or 1.8 volts. However, the pull-down signal is slightly delayed to synchronize it with the delayed pull-up signal 204. Similarly, a logic high at Data-In 114, drives node 638 and the pull-down signal to logic low, or zero volts.

The NAND gates 622 and 626 and the NOR gate 624 are used to disable pull-up and pull-down stacks of the push-pull buffer/driver circuit during high-impedance, tri-state mode. With $\overline{\text{Tri-state Enable}}$ 116 signal at logic low, meaning the tri-state mode is enabled, the outputs of NAND gates 622 and 626 are forced to logic high while the output of NOR gate 624 is forced to logic low. This configuration keeps $P_{up}$ 204 at 3.3 volts and $P_{down}$ 210 at zero volts when 5 volts or zero volts is being received on the PIN out 112 to protect pull-up and pull-down transistors.

Figure 7:
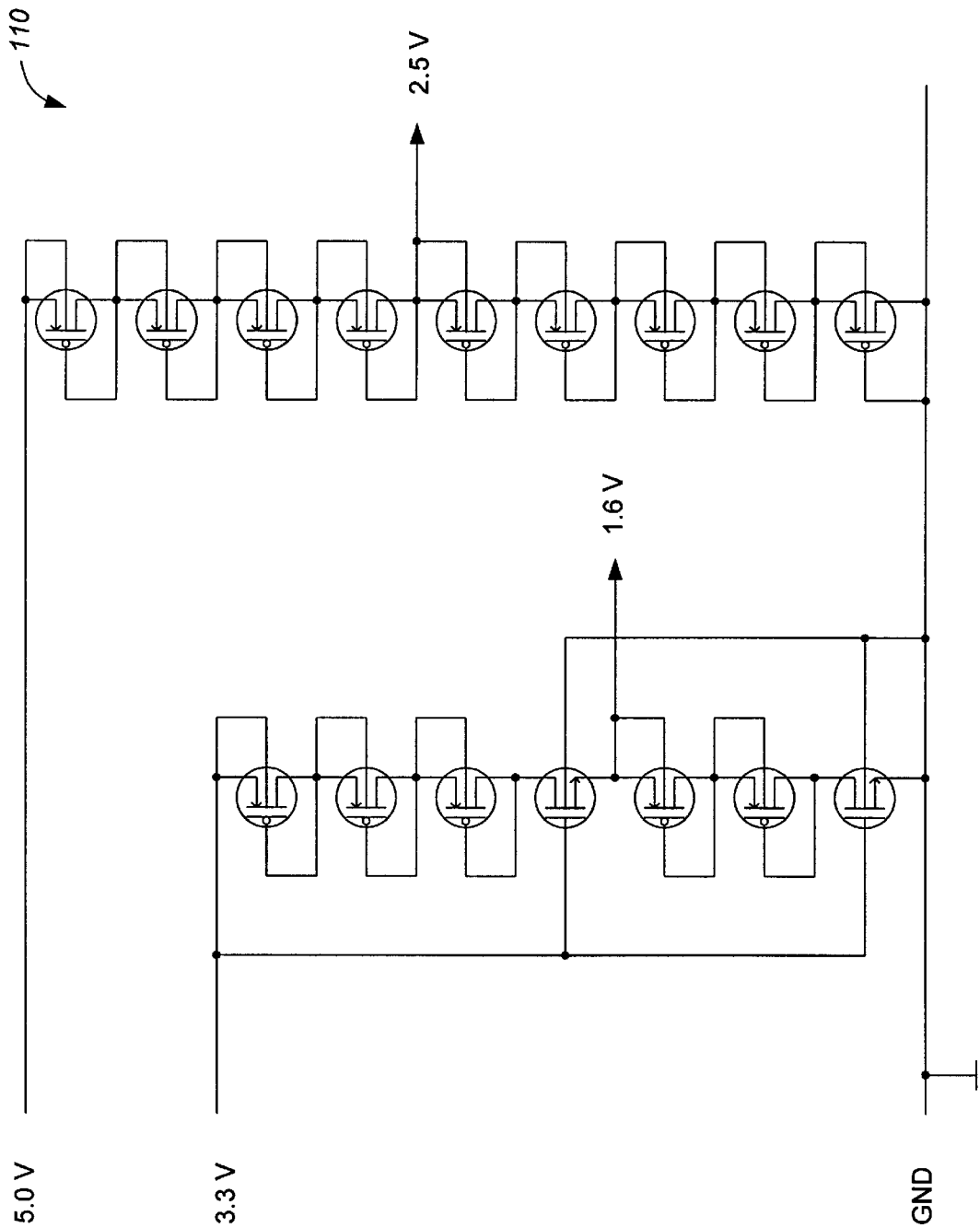
FIG. 7 is a schematic diagram of a bias generator.

FIG. 7 shows a schematic diagram of a bias generator. The bias generator generates two intermediate voltages, 1.6 volts and 2.5 volts, from 3.3-volt and 5-volt supplies respectively. The 2.5-volt output is used during power up to protect transistor devices when 5-volt supply is fully charged and 3.3-volt supply is not charged at all. The 1.6-volt output is used as an intermediate bias voltage.

Figure 8:
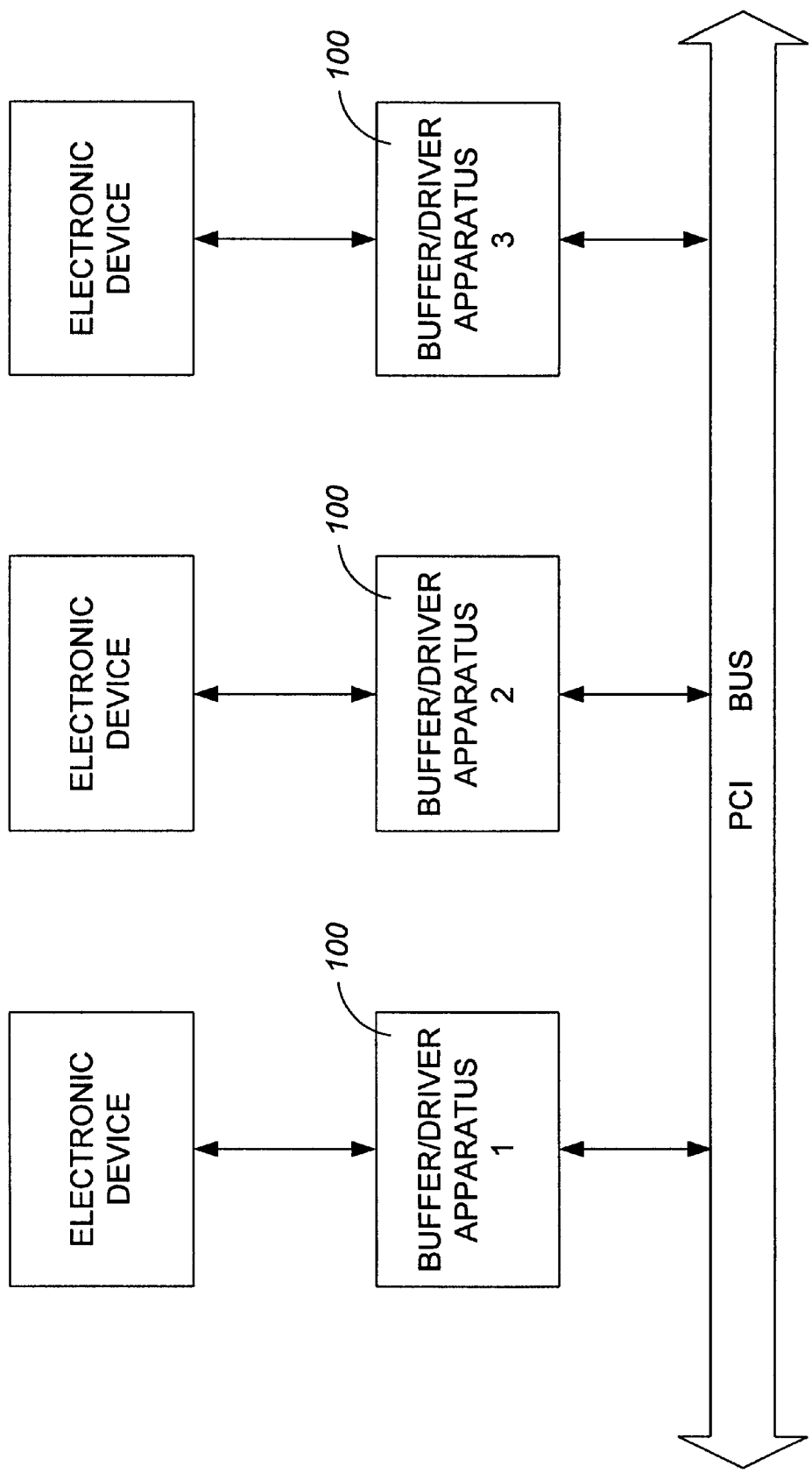
FIG. 8 is a block diagram of a PCI bus system having multiple buffer/driver apparatuses.

FIG. 8 shows a block diagram of a PCI bus system having multiple buffer/driver apparatuses. The PCI bus system can interconnect a large number of electronic devices. The system must maintain, manage and communicate bi-directional data from one device to another device or several devices at once. Each device may output different voltage levels while maintaining capability to read data on the bus. Some devices may even be of low voltage type that are incapable of driving the bus by itself. Therefore, each device may require a buffer/driver apparatus, such as the one described above, for effective management and communication of data.

The buffer/driver apparatus described above can also be used in many other applications similar to the PCI bus system including an integrated drive electronics (IDE) interface system, a parallel port computer interface system, and input/output (I/O) pads.

Although only a few embodiments have been described in detail above, those of ordinary skill in the art certainly understand that modifications are possible. All such modifications are intended to be encompassed within the following claims, in which:

What is claimed is:

1. A buffer/driver apparatus having an input terminal and an output terminal, said buffer/driver apparatus comprising:
   a level-shifter circuit that operates on an input signal on the input terminal to provide output signals, a pull-up signal and a pull-down signal, with wider voltage swings than the input signal,
   the level shifter circuit including:
      connections to power supplies, receiving supply voltages, including an operating voltage, an intermediate voltage and a ground level voltage,
      a differential pair of transistors, one driven by the input signal and the other by an inverted signal of the input signal, directing a current through two different paths,
      a cross-coupled pair of transistors driven by said current to switch the pull-up signal between the intermediate voltage and the operating voltage, and
      a series of inverters operatively connected to the input signal at its input and to the pull-down signal at its output, said series of inverters operating to drive the pull-down signal, such that the pull-down signal switches between the ground level voltage and the intermediate voltage;
   a push-pull circuit operatively connected to the level-shifter circuit, such that output signals of said level shifter circuit controls the push-pull circuit to provide sufficient capability at the output terminal to drive a particular interface connected to the output terminal; and
   an over-voltage detect circuit connected to detect particular voltages at the output terminal, such that an amount of operation of the push-pull circuit can be limited if the particular voltages are detected.

2. The apparatus of claim 1, further comprising:
   a power-up protection circuit operatively connected to the level shifter circuit and the push-pull circuit, said power-up protection circuit generating a bias voltage from a first supply voltage that is a specified amount higher than other supply voltages, such that the bias voltage is applied to the other supply voltages during power-up to avoid exposing devices to high voltage differences.

3. The apparatus of claim 1, wherein the push-pull circuit includes:
   first and second connections to power supplies, receiving supply voltages, including an operating voltage and a ground level voltage, for driving output terminal;
   a pull-up transistor and a pull-down transistor operatively connected with the input terminal and the output terminal, such that a source terminal of the pull-up transistor is connected to the operating voltage and a source terminal of the pull-down transistor is connected to the ground level voltage;
   a first voltage protection transistor coupled between the pull-up transistor and the output terminal; and
   a gate protect transistor coupled between a gate terminal of the first voltage protection transistor and the output terminal, said gate protect transistor and the first voltage protection transistor operating to protect the pull-up transistor from a high external voltage tied to the output terminal, such that the pull-up transistor and the pull-down transistor in push-pull configuration operate in conjunction with the first voltage protection transistor to allow the output terminal to tolerate voltages higher than the operating voltage and to drive the output terminal as high as the operating voltage.

4. The apparatus of claim 3, further comprising:
   a second voltage protection transistor coupled between the output terminal and the pull-down transistor, said second voltage protection transistor operating to protect the pull-down transistor from being driven too low.

5. A buffer/driver apparatus having an input terminal and an output terminal, said buffer/driver apparatus comprising:
   a level shifter circuit that shifts and divides an input signal on the input terminal, the level shifter circuit including:
      connections to power supplies, receiving supply voltages, including an operating voltage, an intermediate voltage and a ground level voltage,
      a differential pair of transistors, one driven by the input signal and the other by an inverted signal of the input signal, directing a current through two different paths, a cross-coupled pair of transistors driven by said current to switch the pull-up signal between the intermediate voltage and the operating voltage, and a series of inverters operatively connected to the input signal at its input and to the pull-down signal at its output, said series of inverters operating to drive the pull-down signal, such that the pull-down signal switches between the ground level voltage and the intermediate voltage;

a push-pull circuit having a pull-up device and a pull-down device, said push-pull circuit being driven by the output signals of said level shifter circuit, such that the push-pull circuit is operatively connected to the output terminal to drive an output circuit operating at a higher level than said operating voltage; and an over-voltage detect circuit connected to detect a voltage at the output terminal and operating to limit an amount of operation of the push-pull circuit and to avoid exposing the pull-up device to high voltage swings.

6. The apparatus of claim 1, further comprising:

a pair of voltage protection transistors connected in series between the differential pair of transistors and the cross-coupled pair of transistors, such that said pair of voltage protection transistors protect the cross-coupled pair by reducing the voltage swing of the pull-up signal at the output of the cross-coupled pair of transistors.

7. The apparatus of claim 6, wherein, the cross-coupled pair of transistors and the pair of voltage protection transistors are p-channel metal oxide silicon field effect transistors.

8. The apparatus of claim 6, wherein the differential pair of transistors are vertical, double-diffused metal oxide silicon field effect transistors.

9. The apparatus of claim 1, further comprising:

at least one output gain amplifier stage, where an output gain amplifier includes a series of transistors connected between the operating voltage and the ground level voltage, and driven by the pull-up signal and the data input, such that said at least one output gain amplifier produces higher drive for the pull-up signal.

10. The apparatus of claim 5, wherein the push-pull circuit includes:

first and second connections to power supplies, receiving supply voltages, including an operating voltage and a ground level voltage, for driving output terminal;

a pull-up transistor and a pull-down transistor operatively connected with the input terminal and the output terminal, such that a source terminal of the pull-up transistor is connected to the operating voltage and a source terminal of the pull-down transistor is connected to the ground level voltage;

a first voltage protection transistor coupled between the pull-up transistor and the output terminal;

a gate protect transistor coupled between a gate terminal of the first voltage protection transistor and the output terminal, said gate protect transistor and the first voltage protection transistor operating to protect the pull-up transistor from a high external voltage tied to the output terminal, such that the pull-up transistor and the pull-down transistor in push-pull configuration operate in conjunction with the first voltage protection transistor to allow the output terminal to tolerate voltages higher than the operating voltage and to drive the output terminal as high as the operating voltage.

11. The apparatus of claim 10, further comprising:

a second voltage protection transistor coupled between the output terminal and the pull-down transistor, said second voltage protection transistor operating to protect the pull-down transistor from being driven too low.

12. The apparatus of claim 5, wherein the over-voltage detect circuit has an in node and an out node, such that the in node is connected to the output terminal, the over-voltage detect circuit including:

connections to power supplies, receiving supply voltages, including an operating voltage, an intermediate voltage and a ground level voltage;

a plurality of transistors connected in series between the in node and the ground level voltage, said plurality of transistors including an output transistor, such that the plurality of transistors operate to detect when the in node is above the operating voltage and generate an appropriate voltage at the out node; and an input latch to drive the out node through the output transistor when the in node is at low voltage, such that the out node is appropriately driven between the intermediate voltage and the ground level voltage to indicate that the in node is above the operating voltage.

13. The apparatus of claim 12, wherein the intermediate voltage is nominally between zero and 1.8 volts and the operating voltage is nominally between said intermediate voltage and 3.3 volts.

14. The apparatus of claim 5, further comprising:

a power-up protection circuit operatively connected to the level-shifter circuit and the push-pull circuit, said power-up protection circuit generating a bias voltage from a first supply voltage that powers up to a specified amount higher than a second supply voltage, such that the bias voltage is applied to the second supply voltage during power-up to avoid exposing devices to high voltage differences.

15. The apparatus of claim 14, wherein the power-up protection circuit includes a bias generator that generates a bias voltage for the pull-up signal to reduce the high voltage exposure during power-up.

16. The apparatus of claim 15, wherein the power-up protection circuit includes:

connections to power supplies, receiving supply voltages, including a higher voltage and an operating voltage;

a plurality of diodes connected to the higher voltage;

a first transistor and a second transistor providing a current path from the high voltage through the plurality of diodes to the operating voltage terminal, such that the plurality of diodes and the first and the second transistors provides a voltage bias at the operating voltage terminal during power-up.

17. The apparatus of claim 16, further comprising:

a third transistor connected between the voltage bias generated by the bias generator and the pull-up signal, the third transistor configured to operate during power-up when the operating voltage is at ground level and the high voltage is at its peak level.

18. The apparatus of claim 4, wherein the pull-up signal and the pull-down signal generate voltages nominally between zero and 3.3 volts.

19. A buffer/driver apparatus having an input terminal and an output terminal, said buffer/driver apparatus comprising:

first and second connections to power supplies, receiving supply voltages, including an operating voltage and a ground level voltage, for driving output terminal;

a pull-up transistor and a pull-down transistor operatively connected with the input terminal and the output terminal, such that a source terminal of the pull-up transistor is connected to the operating voltage and a source terminal of the pull-down transistor is connected to the ground level voltage, where said pull-down transistor is a vertical, double diffused metal oxide silicon field effect transistor that can tolerate over 6 volts;

a first voltage protection transistor coupled between the pull-up transistor and the output terminal;

a gate protect transistor coupled between a gate terminal of the first voltage protection transistor and the output terminal, said gate protect transistor and the first voltage protection transistor operating to protect the pull-up transistor from a high external voltage tied to the output terminal, such that the pull-up transistor and the pull-down transistor in push-pull configuration operate in conjunction with the first voltage protection transistor to allow the output terminal to tolerate voltages higher than the operating voltage and to drive the output terminal as high as the operating voltage.

20. The apparatus of claim 19, further comprising:
a second voltage protection transistor coupled between the output terminal and the pull-down transistor, said second voltage protection transistor operating to protect the pull-down transistor from being driven too low.

21. The apparatus of claim 20, wherein
the pull-up transistor, the first voltage protection transistor, and the gate protect transistor are p-channel metal oxide silicon field effect transistors, and
the pull-down transistor and the second voltage protection transistor are n-channel metal oxide silicon field effect transistors.

22. The apparatus of claim 21, wherein the second voltage protection transistor is a vertical, double-diffused metal oxide silicon field effect transistor.

23. The apparatus of claim 19, further comprising,
a pull-down stack of transistors connected to the gate terminal of the first voltage protection transistor, the pull-down stack of transistors including:
a fourth voltage protection transistor and a fifth voltage protection transistor; and
a sixth transistor connected as a pull-down transistor, the fourth, fifth and sixth transistors connected such that the pull-down stack of transistors operates to protect the first voltage protection transistor when the first voltage protection transistor is aiding the pull-up transistor to drive the output terminal to the operating voltage and to receive high voltage at the output terminal.

24. The apparatus of claim 23, wherein
the fourth voltage protection transistor is a p-channel metal oxide silicon field effect transistor, and
the fifth voltage protection transistor and the sixth transistor are n-channel metal oxide silicon field effect transistors.

25. The apparatus of claim 24, wherein the fifth voltage protection transistor is a vertical, double-diffused metal oxide silicon field effect transistor.

26. The apparatus of claim 19, wherein the gate protect transistor is driven by a protect signal, the protect signal coupled to a gate terminal of the gate protect transistor and generating an appropriate voltage level at the gate terminal depending on a voltage level of the output terminal, such that the protect signal operates to protect the gate protect transistor from being exposed to wide voltage swings.

27. The apparatus of claim 26, wherein the protect signal is generated by a protect circuit having an in node and an out node, such that the in node is connected to the output terminal, said protect circuit including:

connections to power supplies, receiving supply voltages, including an operating voltage and an intermediate voltage, for driving the out node to voltages between the operating voltage and the intermediate voltage;

a first plurality of transistors connected in series between the in node and the out node to drive the out node towards the intermediate voltage when the in node is receiving low voltage;

a second plurality of transistors connected in series between the in node and the out node, said second plurality of transistors in parallel configuration with the first plurality of transistors, and the second plurality of transistors driving the out node towards the operating voltage when the in node is receiving a high voltage; and a bias transistor to provide bias voltage to the second plurality of transistors to prevent the out node from being pulled up to the high voltage.

28. The apparatus of claim 27, further comprising:
a power-up bias transistor to provide bias voltage to the second plurality of transistors, during power-up, when the operating voltage is still at a low voltage, said power-up bias transistor connected to prevent the out node from being pulled up to the high voltage and protecting the second plurality of transistors from a high voltage swing.

29. The apparatus of claim 28, further comprising:
a first clamping transistor having a gate, a source, and a drain terminal, the gate and the source terminals of the first clamping transistor connected to the operating voltage, and the drain terminal of the first clamping transistor connected to the out node; and a second clamping transistor having a gate, a source, and a drain terminal, the gate and the source terminals of the second clamping transistor connected to the intermediate voltage, and the drain terminal of the second clamping transistor connected to the out node, such that the first and the second clamping transistors bound voltages at the out node between the operating and the intermediate voltages.

30. The apparatus of claim 29, wherein the intermediate voltage is nominally between zero and 1.8 volts and the operating voltage is nominally between said intermediate voltage and 3.3 volts.

31. A peripheral component interconnect bus system having multiple voltages on a bus, said bus system comprising:
a plurality of buffer/driver apparatuses, each buffer/driver apparatus capable of driving the bus and receiving data from the bus, such that a driver in said buffer/driver apparatus generates zero to 3.3 volts according to an input signal from a low voltage device, and a buffer in said buffer/driver apparatus protects the low voltage device from voltages as high as 6.5 volts present on the bus.

32. The bus system of claim 31, wherein the buffer/driver apparatus has an input terminal and an output terminal, the buffer/driver apparatus including:
a level-shifter circuit that operates on an input signal on the input terminal to provide a first signal with wider voltage swings than the input signal;

a push-pull circuit operatively connected to the level-shifter circuit, such that the first signal controls the push-pull circuit to provide sufficient capability at the output terminal to drive a particular interface connected to the output terminal; and an over-voltage detect circuit connected to detect particular voltages at the output terminal, such that an amount of operation of the push-pull circuit can be limited if the particular voltages are detected.

33. The bus system of claim 32, further comprising:
a power-up protection circuit operatively connected to the level shifter circuit and the push-pull circuit, said power-up protection circuit generating a bias voltage from a first supply voltage that is a specified amount higher than other supply voltages, such that the bias voltage is applied to the other supply voltages during power-up to avoid exposing devices to high voltage differences.

34. An integrated drive electronics interface system having multiple voltages on an interface, said system comprising:
a plurality of buffer/driver apparatuses, each buffer/driver apparatus capable of driving the interface and receiving data from the interface, such that a driver in said butter/driver apparatus generates zero to 3.3 volts according to an input signal from a low voltage device, and a buffer in said buffer/driver apparatus protects the low voltage device from voltages as high as 6.5 volts present on the interface,
said each buffer/driver apparatus having an input terminal and an output terminal, and including:
a level-shifter circuit that operates on an input signal on the input terminal to provide output signals, a pull-up signal and a pull-down signal, with wider voltage swings than the input signal,
the level shifter circuit including:
connections to power supplies, receiving supply voltages, including an operating voltage, an intermediate voltage and a ground level voltage,
a differential pair of transistors, one driven by the input signal and the other by an inverted signal of the input signal, directing a current through two different paths,
a cross-coupled pair of transistors driven by said current to switch the pull-up signal between the intermediate voltage and the operating voltage, and
a series of inverters operatively connected to the input signal at its input and to the pull-down signal at its output, said series of inverters operating to drive the pull-down signal, such that the pull-down signal switches between the ground level voltage and the intermediate voltage;
a push-pull circuit operatively connected to the level-shifter circuit, such that output signals of said level shifter circuit controls the push-pull circuit to provide sufficient capability at the output terminal to drive a particular interface connected to the output terminal; and
an over-voltage detect circuit connected to detect particular voltages at the output terminal, such that an amount of operation of the push-pull circuit can be limited if the particular voltages are detected.

35. The system of claim 34, wherein the buffer/driver apparatus has an input terminal and an output terminal, the buffer/driver apparatus including:
a level-shifter circuit that operates on an input signal on the input terminal to provide a first signal with wider voltage swings than the input signal;
a push-pull circuit operatively connected to the level-shifter circuit, such that the first signal controls the push-pull circuit to provide sufficient capability at the output terminal to drive a particular interface connected to the output terminal; and
an over-voltage detect circuit connected to detect particular voltages at the output terminal, such that an amount of operation of the push-pull circuit can be limited if the particular voltages are detected.

36. The system of claim 35, further comprising:
a power-up protection circuit operatively connected to the level shifter circuit and the push-pull circuit, said power-up protection circuit generating a bias voltage from a first supply voltage that is a specified amount higher than other supply voltages, such that the bias voltage is applied to the other supply voltages during power-up to avoid exposing devices to high voltage differences.

37. A parallel port computer interface system having multiple voltages on an interface, said system comprising:
a plurality of buffer/driver apparatuses, each buffer/driver apparatus capable of driving the interface and receiving data from the interface, such that a driver in said buffer/driver apparatus generates zero to 3.3 volts according to an input signal from a low voltage device, and a buffer in said buffer/driver apparatus protects the low voltage device from voltages as high as 6.5 volts present on the interface,
said each buffer/driver apparatus having an input terminal and an output terminal, and including:
a level-shifter circuit that operates on an input signal on the input terminal to provide output signals, a pull-up signal and a pull-down signal, with wider voltage swings than the input signal,
the level shifter circuit including:
connections to power supplies, receiving supply voltages, including an operating voltage, an intermediate voltage and a ground level voltage,
a differential pair of transistors, one driven by the input signal and the other by an inverted signal of the input signal, directing a current through two different paths,
a cross-coupled pair of transistors driven by said current to switch the pull-up signal between the intermediate voltage and the operating voltage, and
a series of inverters operatively connected to the input signal at its input and to the pull-down signal at its output, said series of inverters operating to drive the pull-down signal, such that the pull-down signal switches between the ground level voltage and the intermediate voltage;
a push-pull circuit operatively connected to the level-shifter circuit, such that output signals of said level shifter circuit controls the push-pull circuit to provide sufficient capability at the output terminal to drive a particular interface connected to the output terminal; and
an over-voltage detect circuit connected to detect particular voltages at the output terminal, such that an amount of operation of the push-pull circuit can be limited if the particular voltages are detected.

38. The system of claim 37, further comprising:
a power-up protection circuit operatively connected to the level shifter circuit and the push-pull circuit, said power-up protection circuit generating a bias voltage from a first supply voltage that is a specified amount higher than other supply voltages, such that the bias voltage is applied to the other supply voltages during power-up to avoid exposing devices to high voltage differences.

39. The apparatus of claim 5, wherein said higher level is between about 3.5 and 6.5 volts.

\* \* \* \* \*